(12) United States Patent
Kim

(10) Patent No.: US 8,519,738 B2
(45) Date of Patent: Aug. 27, 2013

(54) IMPEDANCE CALIBRATION CIRCUIT AND SEMICONDUCTOR APPARATUS USING THE SAME

(75) Inventor: Ki Ho Kim, Icheon-si (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 13/342,547

(22) Filed: Jan. 3, 2012

(65) Prior Publication Data

US 2012/0105100 A1 May 3, 2012

Related U.S. Application Data

(62) Division of application No. 12/846,199, filed on Jul. 29, 2010, now Pat. No. 8,111,084.

(30) Foreign Application Priority Data

Apr. 30, 2010 (KR) .................. 10-2010-0040548

(51) Int. Cl.
*H03K 19/003* (2006.01)

(52) U.S. Cl.
USPC ............................................. 326/30; 326/26

(58) Field of Classification Search
USPC ................................................ 326/21, 26, 30
See application file for complete search history.

(56) References Cited

U.S. PATENT DOCUMENTS

| 7,148,721 | B2* | 12/2006 | Park | 326/30 |
| 7,808,270 | B2* | 10/2010 | Fujisawa | 326/30 |
| 2011/0193590 | A1* | 8/2011 | Nakagawa et al. | 326/30 |

* cited by examiner

*Primary Examiner* — James H Cho
(74) *Attorney, Agent, or Firm* — William Park & Associates Patent Ltd.

(57) ABSTRACT

An impedance calibration circuit includes: a first calibration unit configured to compare a first converted voltage obtained by converting a first calibration signal with a reference voltage and vary the first calibration signal; a voltage detection unit configured to activate a voltage detection signal according to a level of a power supply voltage; a multiplexing unit configured to select and output the reference voltage or the first converted voltage in response to the detection signal; and a second calibration unit configured to compare a second converted voltage obtained by converting a second calibration signal with the level of the output signal of the multiplexing unit and vary the second calibration signal.

4 Claims, 6 Drawing Sheets

IMPEDANCE CALIBRATION CIRCUIT AND SEMICONDUCTOR APPARATUS USING THE SAME

CROSS-REFERENCES TO RELATED APPLICATION

The present application claims priority under 35 U.S.C. §119(a) to Korean application number 10-2010-0040548, filed on Apr. 30, 2010, in the Korean Intellectual Property Office, which is incorporated herein by reference in its entirety as set forth in full.

BACKGROUND

1. Technical Field

The present invention relates to a semiconductor apparatus, and more particularly, to an impedance calibration circuit and a semiconductor apparatus using the same.

2. Related Art

In order to improve an output characteristic of a semiconductor apparatus, it is very important to constantly maintain termination impedance.

That is, impedance values of various termination circuits, for example, a data output driver and so on should be matched with a target value which is set during design.

However, since the semiconductor apparatus is sensitive to a process, voltage, or temperature (PVT) variation, there is a demand for a circuit configuration capable of constantly maintaining impedance in correspondence to the PVT variation.

SUMMARY

An impedance calibration circuit capable of constantly maintaining impedance in correspondence to a variation of a power supply voltage is described herein.

In one embodiment of the present invention, an impedance calibration circuit includes: a first calibration unit configured to compare a first converted voltage obtained by converting a first calibration signal with a reference voltage and vary the first calibration signal; a voltage detection unit configured to activate a voltage detection signal according to a level of a power supply voltage; a multiplexing unit configured to select and output the reference voltage or the first converted voltage in response to the detection signal; and a second calibration unit configured to compare a second converted voltage obtained by converting a second calibration signal with the level of the output signal of the multiplexing unit and vary the second calibration signal.

In another embodiment of the present invention, a semiconductor apparatus includes: a first calibration unit configured to compare a first converted voltage obtained by converting a first calibration signal with a reference voltage and vary the first calibration signal; a second calibration unit configured to compare a second converted voltage obtained by converting a second calibration signal with the level of the first converted voltage and vary the second calibration signal; and an impedance matching circuit configured to set impedance of signal input/output terminals to a target value according to the first and second calibration signals.

BRIEF DESCRIPTION OF THE DRAWINGS

Features, aspects, and embodiments are described in conjunction with the attached drawings, in which.

DETAILED DESCRIPTION

Hereinafter, an impedance calibration circuit and a semiconductor apparatus using the same according to embodiments of the present invention will be described below with reference to the accompanying drawings through exemplary embodiments.

Figure 1:
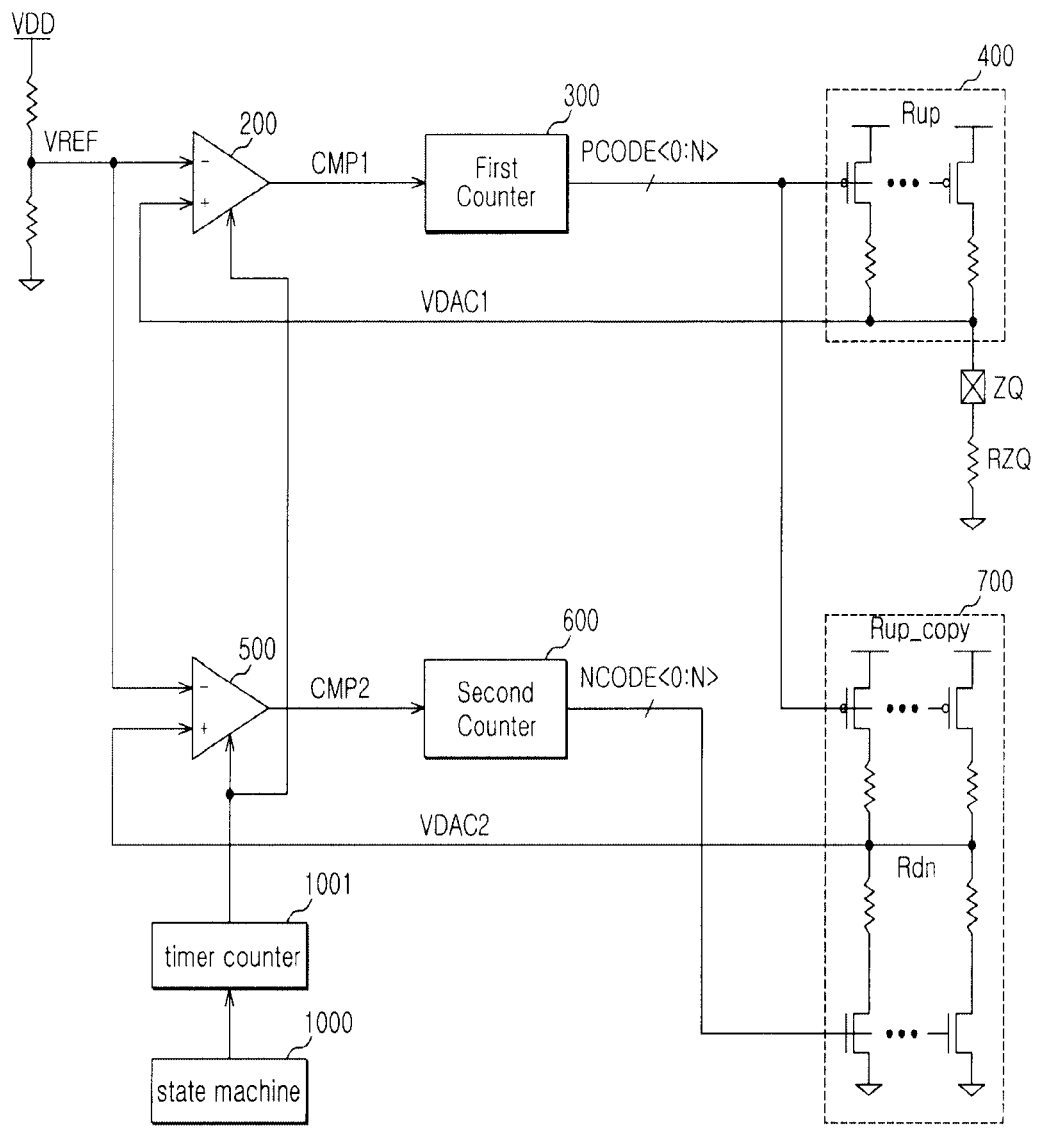
FIG. 1 is a block diagram of an impedance calibration circuit according to one embodiment.

Referring to FIG. 1, an impedance calibration circuit 100 according to one embodiment includes a first comparator 200, a first counter 300, a first digital/analog converter 400, a second comparator 500, a second counter 600, and a second digital/analog converter 700. The first comparator 200 is operatively coupled to the first counter 300 and also to the first digital/analog converter 400. The first counter 300 is operatively coupled to the first digital/analog converter 400 and also to the second digital/analog converter 700. The terminology "operatively coupled" as used herein refers to coupling that enables operational and/or functional communication and relationships there-between and may include any intervening items necessary to enable such communication such as, for example, data communication buses or any other necessary intervening items that one of ordinary skill would understand to be present. Also, it is to be understood that other intervening items may be present between "operatively coupled" items even though such other intervening items are not necessary to the functional communication facilitated by the operative coupling. For example, a data communication bus may provide data to several items along a pathway along which two or more items are operatively coupled, etc. Such operative coupling is shown generally in the figures described herein.

The impedance calibration circuit 100 according to the embodiment may further include a state machine 1000 configured to generate a variety of commands, "cmds," for determining an impedance calibration time and a timer counter 1001 configured to generate a variety of control signals in response to the commands. The control signals may control the first comparator 200 and the second comparator 500.

The first comparator 200 is configured to compare a first converted voltage VDAC1 with a reference voltage VREF to generate a first comparison signal CMP1.

The reference voltage VREF may be VDD/2, and may be obtained using a voltage divider as shown in FIG. 1. It is to be understood that the reference voltage VREF may be obtained from a power bus of a semiconductor apparatus, such as an integrated circuit, or any other appropriate source.

The first counter 300 is operatively coupled to the first comparator 200, and is configured to vary a first calibration signal, that is, a first code PCODE<0:N> in response to the first comparison signal CMP1. The first comparison signal is received by the first counter 300 as an input from the first comparator 200 and the first code PCODE<0:N> is provided by the first counter 300 as an output.

The first digital/analog converter 400, is operatively coupled to the first counter 300, and is configured to convert a digital signal, that is, the first code PCODE<0:N> obtained from the first counter 300, into an analog signal, that is, the first converted voltage VDAC1.

The first digital/analog converter 400 is operatively coupled to the first counter 300 and to the first comparator 200, and includes a plurality of legs, each leg composed of a PMOS transistor and a resistor in series.

The PMOS transistor of each leg includes a gate to which the corresponding bit of the first code PCODE<0:N> is inputted.

Therefore the PCODE is input over data lines to appropriate gates of the transistors that form the plurality of legs of the first digital/analog converter 400. The plurality of legs of the first digital/analog converter 400 are operatively coupled to a power supply terminal. The total resistance of the resistors coupled to the power supply terminal by the first code PCODE<0:N> are represented by Rup.

The first digital/analog converter 400 is coupled to an external resistor RZQ through an external resistor coupling pin ZQ. Because the external resistor RZQ is implemented outside of, that is, external to, a semiconductor memory apparatus, the external resistor RZQ may have a constant resistance value, for example, 240 ohm regardless of a PVT variation within the semiconductor memory apparatus.

The second comparator 500 is also operatively coupled to the reference voltage VREF as an input, and is configured to compare a second converted voltage VDAC2 with the reference voltage VREF and generate a second comparison signal CMP2.

The second counter 600 is operatively coupled to the second comparator 500, and is configured to vary a second calibration signal, that is, a second code NCODE<0:N> in response to the second comparison signal CMP2.

The second digital/analog converter 700, is operatively coupled to both the first counter 300 and the second counter 600, and is configured to convert a digital signal, that is, the second code NCODE<0:N>, into an analog signal, that is, the second converted voltage VDAC2 which is provided as an input to the second comparator 500.

The second digital/analog converter 700 includes a plurality of first legs each composed of a PMOS transistor and a resistor in series and a plurality of second legs each composed of an NMOS transistor and a resistor in series.

The PMOS transistor of each first leg includes a gate to which the corresponding bit of the first code PCODE<0:N> is inputted. The NMOS transistor of each second leg includes a gate to which the corresponding bit of the second code NCODE<0:N> is inputted.

The total resistance of resistors operatively coupled to the power supply terminal through the corresponding transistors by the first code PCODE<0:N> is represented by Rup_copy. At this time, the plurality of first legs are configured in the same manner as the first digital/analog converter 400. Therefore, Rup and Rup_copy are substantially equal to each other.

The total resistance of resistors coupled to a ground terminal by the second code NCODE<0:N> is represented by Rdn.

The impedance calibration operation of the impedance calibration circuit according to the first embodiment will be described as follows.

As described above, the total resistance of the resistors coupled to the power supply terminal by the first code PCODE<0:N> in the plurality of legs of the first digital/analog converter 400 is represented by Rup.

Furthermore, the total resistance of the resistors coupled to the power supply terminal by the first code PCODE<0:N> in the plurality of first legs of the second digital/analog converter 700 is represented by Rup_copy, and the total resistance of the resistors coupled to the ground terminal by the second code NCODE<0:N> in the plurality of second legs is represented by Rdn.

In the first embodiment, Rup is substantially equalized to the resistance value of the external resistor RZQ, and Rdn is substantially equalized to the same value as Rup_copy, for example, 240 ohm, which is substantially equal to Rup. This operation will be described in detail as follows.

The state machine 1000 generates a variety of commands (cmds) for determining an impedance calibration time, and the timer counter 1001 generates a variety of control signals in response to the commands.

The first and second comparators 200 and 500 are operatively coupled to the timer counter 1001 to receive the variety of control signals as shown in FIG. 1, and are operated in response to the variety of control signals. Accordingly, the first counter 300, the first digital/analog converter 400, the second counter 600, and the second digital/analog converter 700 are operated to perform the impedance operation.

First, the first counter 300 outputs the first code PCODE<0:N> as the initial value.

The first digital/analog converter 400 converts the first code PCODE<0:N> into the first converted voltage VDAC1.

The first comparator 200 obtains the first converted voltage VDAC1 from the first digital/analog converter 400, compares it with the reference voltage VREF, and generates the first comparison signal CMP1.

The first counter 300 changes the code values of the first code PCODE<0:N> in response to the first comparison signal CMP1. That is, the first counter 300 increases or decreases the code values.

The first digital/analog converter 400, having obtained the changed PCODE<0:N> code values from the first counter 300, converts the first code into the first converted voltage VDAC1.

When the first converted voltage VDAC1 is lower than the reference voltage VREF, the first code PCODE<0:N> should have code values which may raise the first converted voltage VDAC1. On the other hand, when the first converted voltage VDAC1 is higher than the reference voltage VREF, the first code PCODE<0:N> should have code values which may lower the first converted voltage VDAC1.

Therefore, the first comparator 200 and the first counter 300 are repetitively operated to substantially equalize the first converted voltage VDAC1 to the reference voltage VREF.

When the first converted voltage VDAC1 is substantially equalized to the reference voltage VREF, it means that Rup is substantially equalized to the resistance value of the external resistor RZQ.

After that, a process of substantially equalizing Rdn and Rup_copy is performed in a state in which the calibrated first code PCODE<0:N> is used to substantially equalize Rup_copy and Rup.

That is, the linked operations of the second comparator 500, the second counter 600, and the second digital/analog converter 700 are repeated to vary the code values of the second code NCODE<0:N>. Accordingly, the second converted voltage VDAC2 is substantially equalized to the reference voltage VREF.

At this time, the linked operations of the second comparator 500, the second counter 600, and the second digital/analog converter 700 are performed in the same manner as the linked operations of the first comparator 500, the first counter 300, and the first digital/analog converter 400.

Therefore, when the second converted voltage VDAC2 is substantially equalized to the reference voltage VREF, it means that Rdn and Rup_copy are substantially equalized.

Through this process, the impedance calibration is terminated, and the first code PCODE<0:N> and the second code NCODE<0:N> are provided to a termination circuit, for example, a data output driver.

The impedance of the data output driver is set to the target value by the first code PCODE<0:N> and the second code NCODE<0:N>.

Figure 2:
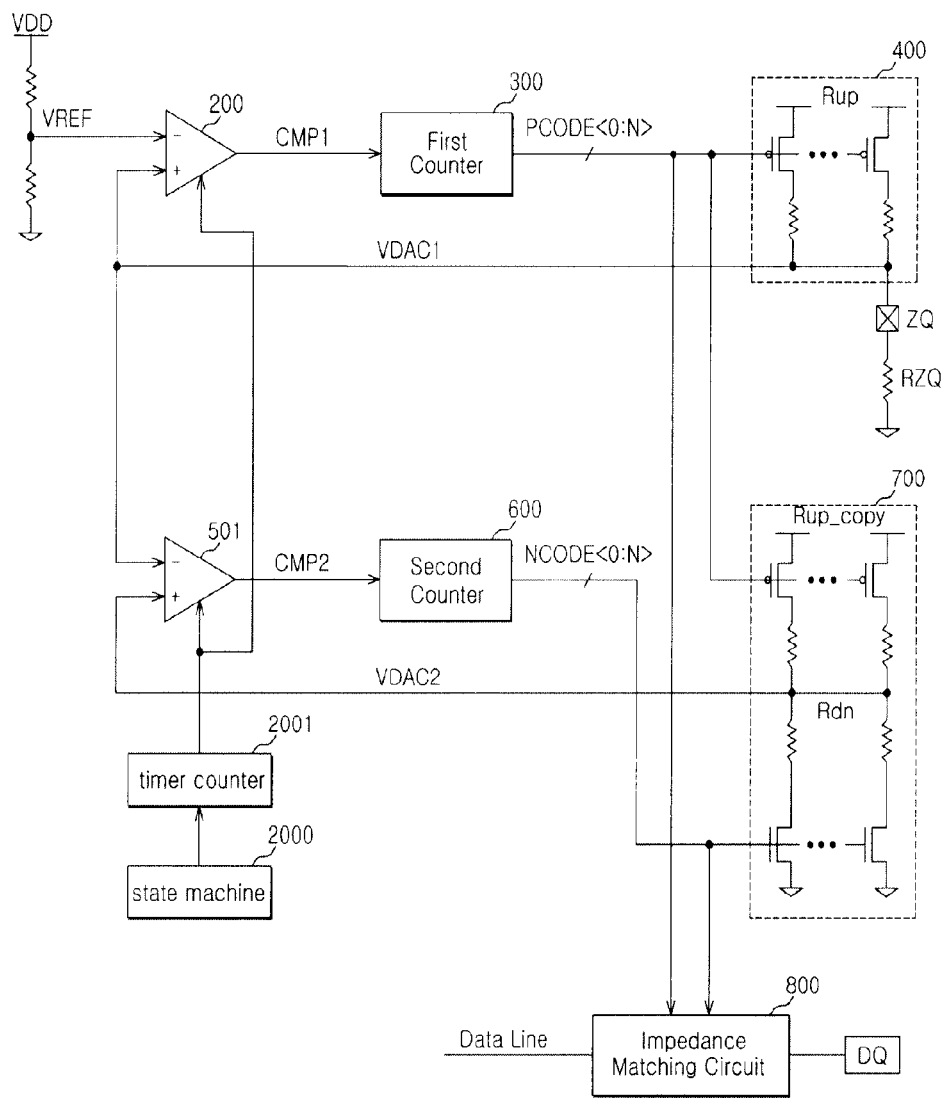
FIG. 2 is a block diagram of a semiconductor apparatus according to another embodiment.

Referring to FIG. 2, a semiconductor apparatus according to another embodiment includes a first comparator 200, a first counter 300, a first digital/analog converter 400, a second comparator 501, a second counter 600, a second digital/analog converter 700, and an impedance matching circuit 800. The first comparator 200 is operatively coupled to VREF, the first counter 300 and to the first digital/analog converter 400. The first counter 300 is operatively coupled to the first comparator 200 and obtains CMP1 as an input. The first counter 300 is operatively coupled to the first digital/analog converter 400 and also to the impedance matching circuit 800.

The impedance calibration circuit 101 according to the embodiment may further include a state machine 2000 configured to generate a variety of commands for determining an impedance calibration time and a timer counter 2001 configured to generate a variety of control signals in response to the commands.

The first comparator 200, the first counter 300, the first digital/analog converter 400, the second counter 600, and the second digital/analog converter 700 may be configured in the same manner as those of the impedance calibration circuit illustrated in FIG. 1.

However, the second comparator 501 is different from the second comparator 500 of the impedance calibration circuit illustrated in FIG. 1, in that the second comparator 501 is configured to compare the second converted voltage VDAC2 with the first converted voltage VDAC1. That is, the second comparator 501 is operatively coupled to the first digital/analog converter 400 and to the second digital/analog converter 700.

The impedance matching circuit 800 is operatively coupled between a data line (that is, to the first counter 300 output and to the second counter 600 output) and a pad DQ for inputting/outputting signals. The impedance matching circuit 800 sets impedance of the pad DQ to a target value according to the first code PCODE<0:N> and the second code NCODE<0:N>.

The impedance calibration circuit 101 according to the embodiment substantially equalizes Rup to the resistance value of the external resistor RZQ, and then equalizes Rdn to the resistance value of the external resistor RZQ.

That is, instead of the reference value VREF, the first converted voltage VDAC1 into which the resistance value of the external resistor RZQ is reflected is compared with the second converted voltage VDAC2. Therefore, a difference between Rup and the resistance value of the external resistor RZQ may be used to reduce a difference between Rdn and the resistance value of the external resistor RZQ.

The impedance calibration operation in this embodiment is performed in the same manner as that of the impedance calibration circuit illustrated in FIG. 1, except that the second comparator 501 compares the second converted voltage VDAC2 with the first converted voltage VDAC1. Therefore, the descriptions thereof will be omitted.

No impedance calibration circuit can perfectly equalize Rup, Rup_copy, and Rdn to the resistance value of the external resistor RZQ. However, the resolution of the first and second digital/analog converters 400 and 700 may be increased to approximate Rup, Rup_copy, and Rdn to the resistance value of the external resistor RZQ.

In the impedance calibration circuit illustrated in FIG. 1, the first comparator 200 and the second comparator 500 operates according to the common reference. That is, the reference voltage VREF is compared with the first or second converted voltage VDAC1 or VDAC2. Therefore, the impedance calibration circuit illustrated in FIG. 1 may stably operate even when the power supply voltage VDD is low.

Figure 6:
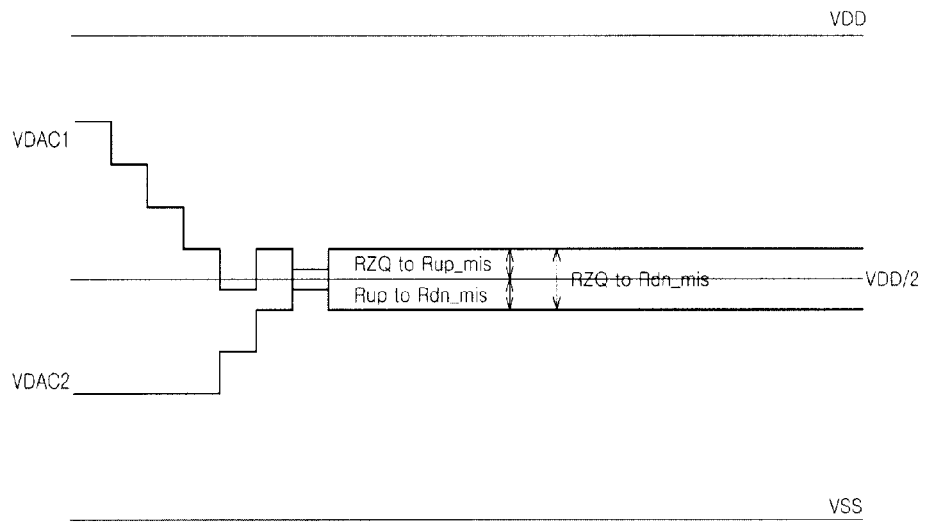
FIGS. 6 through 8 are waveform diagrams explaining the operation principle of the impedance calibration circuit of FIG. 3.

In the impedance calibration circuit illustrated in FIG. 1, however, the difference between Rdn and the resistance value of the external resistor RZQ may be increased by the effect of the difference between Rdn and the resistance value of the external resistor RZQ, as illustrated in FIG. 6.

Figure 7:
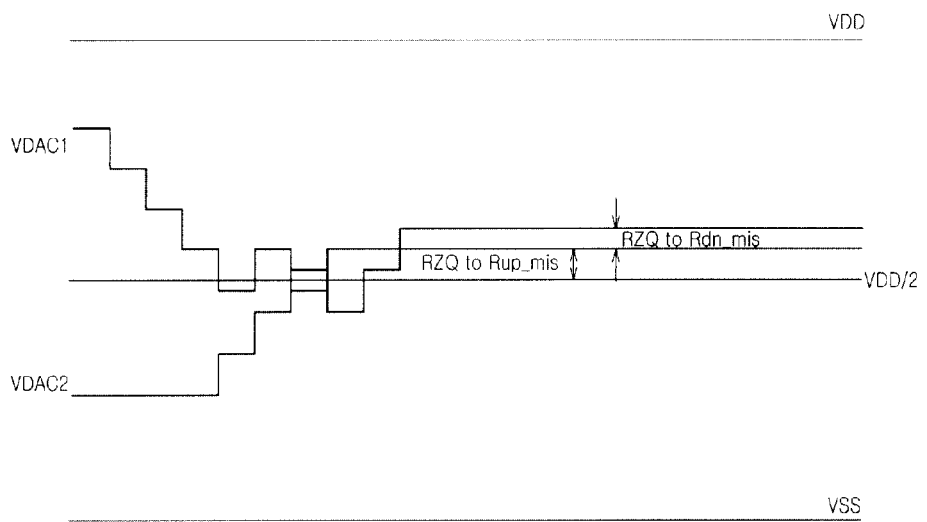
Figure 8:
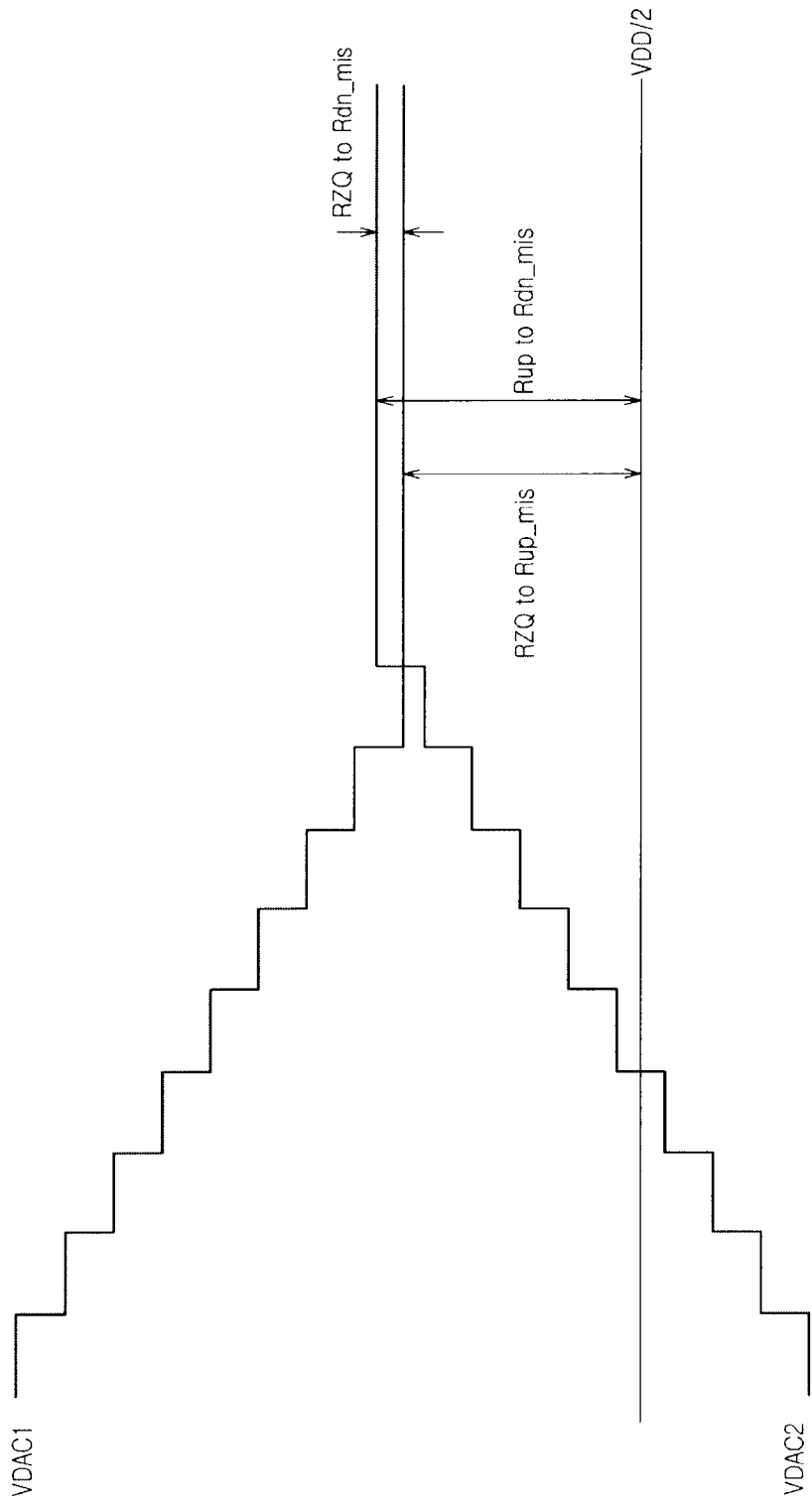

In FIG. 2, the second comparator 501 compares the second converted voltage VDAC2 with the first converted voltage VDAC1 into which the difference between Rup and the resistance value of the external resistor RZQ is reflected. Referring to FIG. 7, the difference between Rdn and the resistance value of the external resistor RZQ may be reduced in comparison with the impedance calibration circuit illustrated in FIG. 1. That is, it is possible to improve the calibration performance.

However, the semiconductor apparatus illustrated in FIG. 2 operates to substantially equalize both Rup and Rdn to the resistance value of the external resistor RZQ. At this time, when Rup does not reach the resistance value of the external resistor RZQ under a low-voltage condition, that is, in a state in which the power supply voltage VDD is lower than a preset level and the first code PCODE<0:N> is calibrated to a maximum or minimum value, Rdn may not reach the resistance value of the external resistor RZQ, either. Then, Rdn may deviate from the calibration range.

Figure 3:
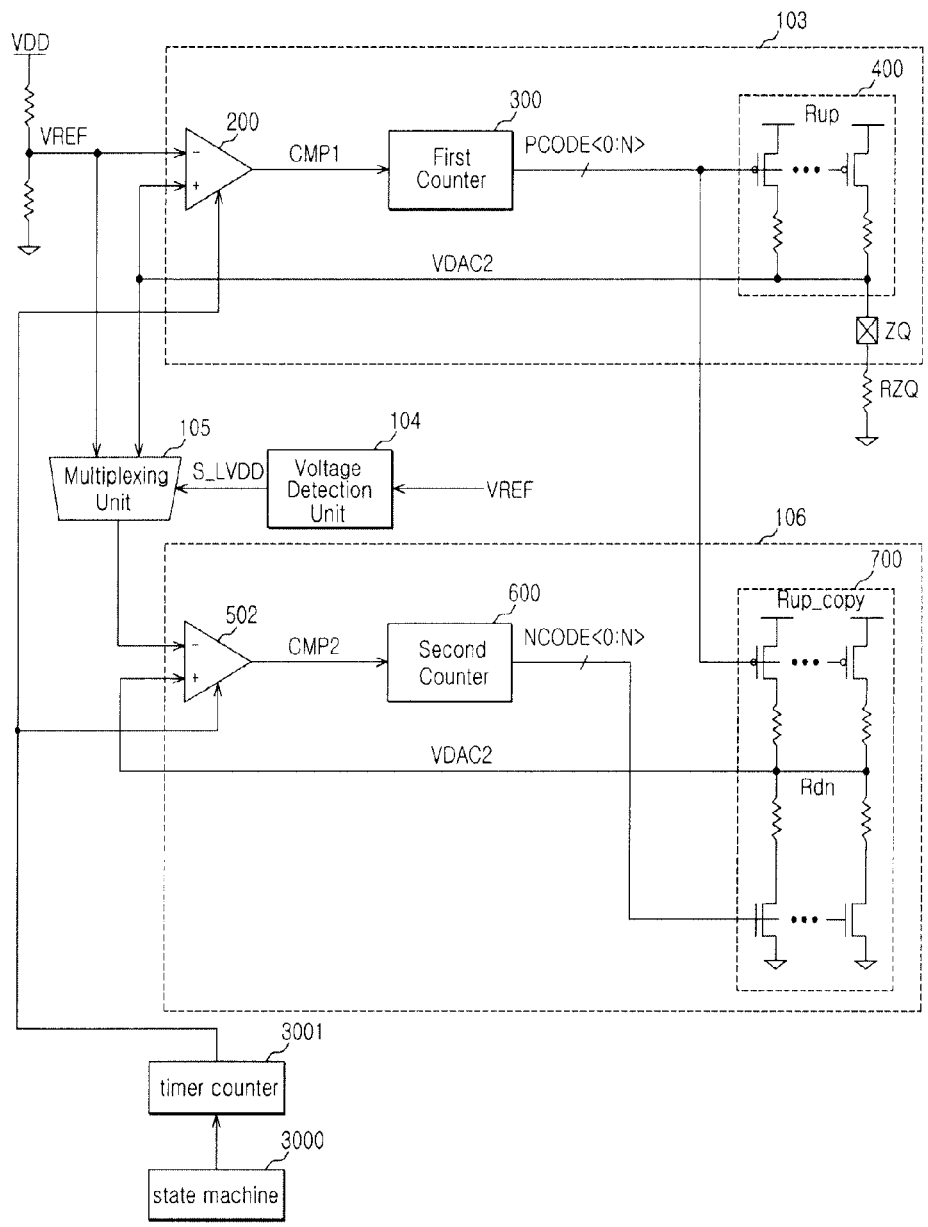
FIG. 3 is a block diagram of an impedance calibration circuit according to another embodiment.

Therefore, referring to FIG. 3, an impedance calibration circuit according to another embodiment takes advantage of the embodiments illustrated in FIGS. 1 and 2 and selectively uses the two methods according to the level of a power supply voltage VDD. Accordingly, the impedance calibration circuit illustrated in FIG. 3 may stably perform the impedance calibration operation in the entire range of the power supply voltage VDD.

Under a low voltage condition, that is, when the power supply voltage VDD is lower than a preset level, the impedance calibration circuit illustrated in FIG. 3 uses the method of FIG. 1 to substantially prevent the deviation from the calibration range. Under a normal voltage or high voltage condition, that is, when the power supply voltage VDD is equal to or higher than the preset level, the impedance calibration circuit illustrated in FIG. 3 uses the method of FIG. 2 to improve the calibration performance.

Referring to FIG. 3, the impedance calibration circuit 102 according to the embodiment includes a first calibration unit 103, a voltage detection unit 104, a multiplexing unit 105, and a second calibration unit 106. The first calibration unit 105 is operatively coupled to the multiplexing unit 105, the second calibration unit 106, and obtains VREF as an input. The multiplexing unit 105 is operatively coupled to the voltage detection unit 104, and to the second calibration unit 106.

The impedance calibration circuit 102 according to the embodiment may further include a state machine (not shown) configured to generate a variety of commands for determining an impedance calibration time and a timer counter (not shown) configured to generate a variety of control signals in response to the commands.

The first calibration unit 103 is configured to compare a first converted voltage VDAC1 obtained by converting a first calibration signal, that is, a first code PCODE<0:N> with a reference voltage VREF and vary the first code PCODE<0:N> such that Rup and the resistance value of an external resistor RZQ are substantially equalized.

The first calibration unit 103 includes a first comparator 200, a first counter 300 operatively coupled to the first comparator 200, and a first digital/analog converter 400 operatively coupled to the first counter 300, the first comparator 200, and the multiplexing unit 105.

The first comparator 200 is configured to compare the first converted voltage VDAC1 with the reference voltage VREF and generate a first comparison signal CMP1.

The first counter 300 is configured to vary the first code PCODE<0:N> in response to the first comparison signal CMP1.

The first digital/analog converter 400 is configured to convert a digital signal, that is, the first code PCODE<0:N> into an analog signal, that is, the first converted voltage VDAC1.

The first digital/analog converter 400 includes a plurality of legs each composed of a PMOS transistor and a resistor in series.

The PMOS transistor of each leg includes a gate into which the corresponding bit of the first code PCODE<0:N> is inputted.

The total resistance of the resistors, which are each operatively coupled to a power supply terminal through each corresponding transistor, by the first code PCODE<0:N>, is represented by Rup.

The first digital/analog converter 400 is coupled to the external resistor RZQ through an external resistor coupling pin ZQ. Because the external resistor RZQ is implemented outside the semiconductor memory, the external resistor RZQ may have a constant resistance value, for example, 240 ohm regardless of a PVT variation within the semiconductor memory apparatus.

The voltage detection unit 104 is configured to detect the level of the power supply voltage VDD and generate a voltage detection signal S_LVDD. As shown in FIG. 3, the voltage detection unit 104 is operatively coupled to VREF as an input, which, as discussed above with respect to FIG. 1, may be VDD/2 obtained via a voltage divider.

The multiplexing unit 105 is configured to select and output the reference voltage VREF or the first converted voltage VDAC1 in response to the voltage detection signal S_LVDD.

The second calibration unit 106 is configured to compare the level of the output signal of the multiplexing unit 105 with a second converted voltage VDAC2 obtained by converting a second calibration signal, that is, a second code NCODE<0:N> and vary the second code NCODE<0:N> such that Rdn is substantially equalized to Rup_copy or the resistance value of the external resistor RZQ.

The second calibration unit 106 includes a second comparator 502, a second counter 600, and a second digital/analog converter 700. The second comparator 502 is operatively coupled to the multiplexing unit 105, the second counter 600, and the second digital/analog converter 700.

The second comparator 502 is configured to compare the second converted voltage VDAC2 with the level of the output signal of the multiplexing unit 105 and generate a second comparison signal CMP2.

The second counter 600 is configured to vary the second code NCODE<0:N> in response to the second comparison signal CMP2.

The second digital/analog converter 700 is configured to convert a digital signal, that is, the second code NCODE<0:N> into an analog signal, the second converted voltage VDAC2.

The second digital/analog converter 700 includes a plurality of first legs each composed of a PMOS transistor and a resistor in series and a plurality of second legs each composed of an NMOS transistor and a resistor in series.

The PMOS transistor of each first leg includes a gate into which the corresponding bit of the first code PCODE<0:N> is inputted.

The NMOS transistor of each second leg includes a gate into which the corresponding bit of the second code NCODE<0:N> is inputted.

The total resistance of the resistors coupled to the power supply terminal by the first code PCODE<0:N>, through the corresponding NMOS transistors, is represented by Rup_copy. The is plurality of first legs are configured in the same manner as the first digital/analog converter 400. Therefore, Rup and Rup_copy are substantially equal to each other.

The total resistance of the resistors coupled to a ground terminal, through the corresponding transistors, by the second code NCODE<0:N>, is represented by Rdn.

Figure 4:
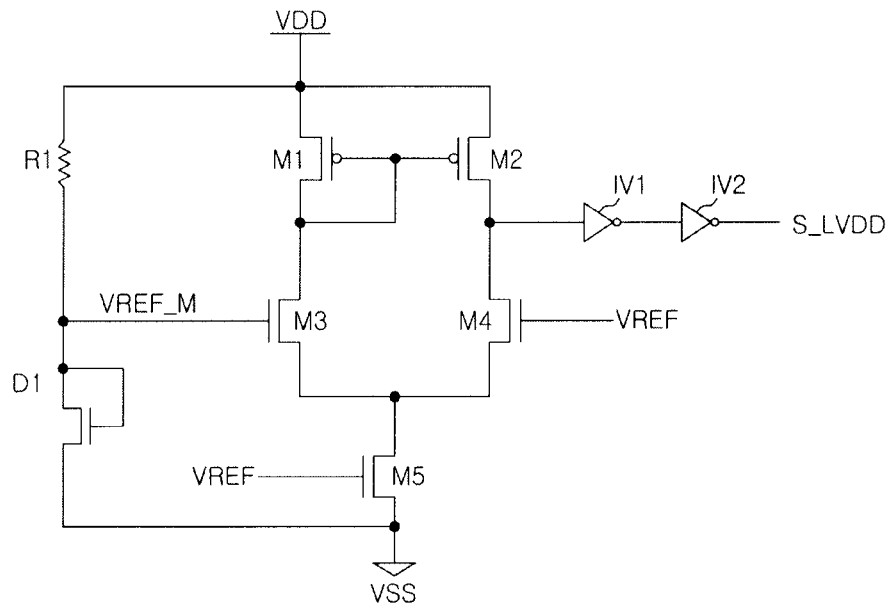
FIG. 4 is a circuit diagram of a voltage detection unit of FIG. 3.

Referring to FIG. 4, the voltage detection unit 104 is configured to compare an internal voltage VREF_M generated by using the power supply voltage VDD with the reference voltage VREF, detect the level of the power supply voltage VDD, and generate a voltage detection signal S_LVDD.

The voltage detection unit 104 includes a resistor R1, a diode D1, a plurality of transistors M1 through M5, and a plurality of inverters IV1 and IV2. The resistor R1 is operatively coupled to VDD at one terminal, and at its other terminal to the gate of M3 and a first current terminal of the diode D1. The diode D1 may be a diode connected transistor. "Current terminal" as used herein refers to both the "source" and "drain" terminal of a transistor interchangeably. Thus first current terminals of transistor M1 and M2 are operatively coupled to VDD. A second current terminal of M1 is operatively coupled to a first current terminal of M3, and a second current terminal of M2 is operatively coupled to a first current terminal of M4. The gate terminal of M1 is operatively coupled to the gate terminal of M2 and also to the first current terminal of M3. The gate terminal of M3 is operatively coupled to R1 and the first current terminal of diode D1. The second current terminals of M3 and M4 are operatively coupled together, and to a first current terminal of M5. A gate terminal of M5 is operatively coupled to VREF and the second current terminal of M5 is operatively coupled to VSS and to a second current terminal of diode D1. The gate terminal of M4 is also operatively coupled to VREF. The second current terminal of M2 is operatively coupled to the first current terminal of M4 and also to an input of inverter IV1. IV1 is operatively coupled to IV2, and IV2 provides the output S_LVDD, that is, the voltage detection signal.

The voltage detection unit 104 detects that the level of the power supply voltage VDD becomes lower than a preset level, and outputs the voltage detection signal S_LVDD at an activation level, for example, a high level. "High level" and "low level" refers to, for example, voltage levels and/or voltage ranges that are predetermined to represent the high level or low level and not necessarily any specific values. It is to be understood that "high level" and "low level" may also be referred to as "logic levels" for example, a "high logic level" and a "low logic level," respectively. Such "logic levels" may also be understood to correspond to logical or binary bit values, for example, where a "low logic level" corresponds to a logical "0" and a "high logic level" corresponds to a logical "1," or vice versa depending on specific implementations in the various embodiments.

Figure 5:
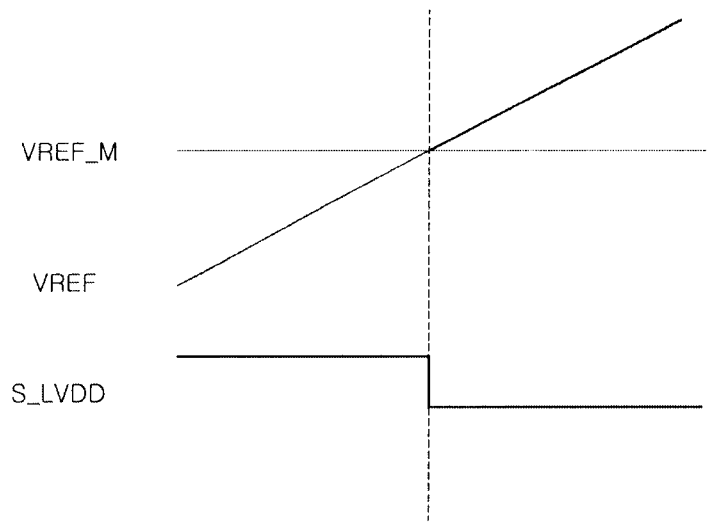
FIG. 5 is an output waveform diagram of the voltage detection unit of FIG. 4.

The internal voltage VREF_M is generated by a node operatively coupled between the resistor R1 and the diode D1, the resistor R1 being operatively coupled between the power supply voltage (VDD) terminal and the ground voltage (VSS) terminal (through the diode D1). Therefore, referring to FIG. 5, the internal voltage VREF_M is constantly maintained according to the characteristics of the resistor and the diode, regardless of a variation of the power supply voltage VDD. The reference voltage VREF may be obtained from a voltage divider circuit interconnected to the power supply voltage VDD and may be VDD/2 as was discussed above.

Therefore, when the reference voltage VREF is higher than the internal voltage VREF_M, the voltage detection unit 104 outputs the voltage detection signal S_LVDD at a low level. On the other hand, when the reference voltage VREF is lower than the internal voltage VREF_M, the voltage detection unit 104 outputs the voltage detection signal S_LVDD at a high level.

The impedance calibration operation of the impedance calibration circuit according to the embodiment will be described as follows.

First, the first code PCODE<0:N> is varied to substantially equalize Rup to the resistance value of the external resistor RZQ.

Subsequently, Rup_copy and Rup are substantially equalized by using the first code PCODE<0:N> when Rup is substantially equalized to the resistance value of the external resistor RZQ.

The second code NCODE<0:N> is varied to substantially equalize Rdn to Rup_copy or the resistance value of the external resistor RZQ.

This process will be described in detail as follows.

The state machine 3000 generates a variety of commands for determining an impedance calibration time, and the timer counter 3001 generates a variety of control signals in response to the commands.

The first and second comparators 200 and 502 are operated in response to the variety of control signals. Accordingly, the first counter 300, the first digital/analog converter 400, the second counter 600, and the second digital/analog converter 700 are operated to perform the impedance calibration operation.

First, the first counter 300 outputs the first code PCODE<0:N> as the initial value.

The first digital/analog converter 400 converts the first code PCODE<0:N> into the first converted voltage VDAC1.

The first comparator 200 compares the first converted voltage VDAC1 with the reference voltage VREF and generates the first comparison signal CMP1.

The first counter 300 varies the code values of the first code PCODE<0:N> in response to the first comparison signal CMP1, that is, increases or decreases the code values.

The first digital/analog converter 400 converts the first code PCODE<0:N> having the changed code values into the first converted voltage VDAC1.

When the first converted voltage VDAC1 is lower than the reference voltage VREF, the first code PCOD<0:N> should have code values capable of raising the first converted voltage VDAC1. Furthermore, when the first converted voltage VDAC1 is higher than the reference voltage VREF, the first code should have code values capable of lowering the first converted voltage VDAC1.

Therefore, the first comparator 200 and the first counter 300 are repetitively operated to substantially equalize the first converted voltage VDAC1 to the reference voltage VREF.

As a result, when the first converted voltage VDAC1 is substantially equalized to the reference voltage VREF, it means that Rup is substantially equalized to the resistance value of the external resistor RZQ.

In such a state in which the calibrated first code PCODE<0:N> is used to substantially equalize Rup_copy and Rup, the process of substantially equalizing Rdn to the resistance value of the external resistor RZQ or Rup_copy is performed.

That is, the linked operations of the second comparator 502, the second counter 600, and the second digital/analog converter 700 are repeated to vary the code values of the second code NCODE<0:N>. Accordingly, the varied second converted voltage VDAC2 is substantially equalized to the reference voltage VREF or the first converted voltage VDAC1.

The linked operations of the second comparator 502, the second counter 600, and the second digital/analog converter 700 are basically performed in the same manner as the linked operations of the first comparator 200, the first counter, and the first digital/analog converter 400.

However, the second comparator 502 compares the second converted voltage VDAC2 with the reference voltage VREF or the first converted voltage VDAC1 according to the level of the power supply voltage VDD, and generates the second comparison signal CMP2.

That is, when the power supply voltage VDD is lower than the preset level, the voltage detection signal S_LVDD is outputted at a high level.

The multiplexing unit 105 outputs the reference voltage VREF in response to the voltage detection signal S_LVDD at a high level.

Therefore, the second comparator 502 compares the second converted voltage VDAC2 with the reference voltage VREF and generates the second comparison signal CMP2.

When the level of the power supply voltage VDD is equal to or higher than the preset level, the voltage detection signal S_LVDD is outputted at a low level.

The multiplexing unit 105 outputs the first converted voltage VDAC1 in response to the voltage detection signal S_LVDD at a low level.

Therefore, the second comparator 502 compares the first converted voltage VDAC1 with the second converted voltage VDAC2 and generates the second comparison signal CMP2.

As a result, when the second converted voltage VDAC2 is substantially equalized to the reference voltage VREF or the first converted voltage VDAC1, it means that Rdn is substantially equalized to Rup_copy or the resistance value of the external resistor RZQ.

Through such a process, the impedance calibration is terminated, and the first code PCODE<0:N> and the second code NCODE<0:N> are provided to a termination circuit, for example, a data output driver.

The impedance of the data output driver is set to a target value by the first code PCODE<0:N> and the second code NCODE<0:N>.

The impedance calibration circuit according to the embodiments of the present invention calibrates impedance by applying a different method according to ranges to which the level of a power supply voltage belongs. Therefore, it is possible to increase impedance calibration performance across the entire range of the power supply voltage.

While certain embodiments have been described above, it will be understood to those skilled in the art that the embodiments described are by way of example only. Accordingly, the impedance calibration circuit and the semiconductor apparatus described herein should not be limited based on the described embodiments. Rather, the impedance calibration circuit and the semiconductor apparatus described herein should only be limited in light of the claims that follow when taken in conjunction with the above description and accompanying drawings.

What is claimed is:

1. A semiconductor apparatus comprising:

a first calibration unit configured to compare a first converted voltage obtained by converting a first calibration signal with a reference voltage and vary the first calibration signal;

a second calibration unit, operatively coupled to the first calibration unit, configured to compare a second converted voltage obtained by converting a second calibration signal with the level of the first converted voltage and vary the second calibration signal;

an impedance matching circuit, operatively coupled to the first calibration unit and to the second calibration unit, configured to set impedance of signal input/output terminals to a target value according to the first and second calibration signals;

a state machine configured to generate a variety of commands for deciding an impedance calibration time; and a timer counter, operatively coupled to the state machine, the first calibration unit and the second calibration unit, and configured to generate a variety of control signals for controlling the first and second calibration units.

2. The semiconductor apparatus according to claim 1, wherein the first calibration unit comprises:

a comparator configured to compare the first converted voltage with the reference voltage and generate a comparison signal;

a counter, operatively coupled to the comparator and to the impedance matching circuit, configured to vary the first calibration signal in response to the comparison signal; and a digital/analog converter, operatively coupled to the counter and to the comparator, configured to convert the first calibration signal into the first converted voltage.

3. The semiconductor apparatus according to claim 2, wherein the digital/analog converter is operatively coupled to an external resistor.

4. The semiconductor apparatus according to claim 1, wherein the second calibration unit comprises:

a comparator configured to compare the second converted voltage with the level of the first converted voltage and generate a comparison signal;

a counter, operatively coupled to the comparator and to the impedance matching circuit, configured to vary the second calibration signal in response to the comparison signal; and a digital/analog converter, operatively coupled to the counter and to the comparator, configured to convert the second calibration signal into the second converted voltage.

* * * * *